US008229155B2

(12) United States Patent

Maurer et al.

(10) Patent No.: US 8,229,155 B2
(45) Date of Patent: Jul. 24, 2012

(54) SPEAKER ASSEMBLY WITH DIRECTIONAL ADJUSTABILITY

(75) Inventors: Ronald D. Maurer, Carlsbad, CA (US); Sean P. McDermott, El Cajon, CA (US); Richard P. Apgar, Lakeside, CA (US)

(73) Assignee: Three Amigos LLC, El Cajon, CA (US)

(*) Notice: Subject to any disclaimer, the term of this patent is extended or adjusted under 35 U.S.C. 154(b) by 404 days.

(21) Appl. No.: 12/436,845

(22) Filed: May 7, 2009

(65) Prior Publication Data

US 2009/0279732 A1 Nov. 12, 2009

Related U.S. Application Data

(60) Provisional application No. 61/051,027, filed on May 7, 2008.

(51) Int. Cl.
*H04R 1/02* (2006.01)
*H04R 25/00* (2006.01)
*H05K 5/00* (2006.01)

(52) U.S. Cl. ........ 381/387; 381/182; 381/186; 381/386; 181/144; 181/145; 181/147

(58) Field of Classification Search .................. 381/182, 381/186, 386, 387; 181/144, 145, 147
See application file for complete search history.

(56) References Cited

U.S. PATENT DOCUMENTS 3,719,250 A 3/1973 Maekawa
3,720,787 A * 3/1973 Ishii et al. .................... 381/336
3,855,429 A * 12/1974 Krainhofer .................. 381/392
4,122,315 A * 10/1978 Schroeder et al. ............ 381/186
4,182,429 A * 1/1980 Senzaki ........................ 181/144
4,440,259 A * 4/1984 Strohbeen ..................... 181/146
4,554,414 A * 11/1985 House ........................... 381/182
4,811,406 A * 3/1989 Kawachi ....................... 381/186
5,133,428 A * 7/1992 Perrson ......................... 181/153
5,319,164 A 6/1994 Shen
5,512,714 A * 4/1996 Fenton .......................... 181/144
5,629,501 A * 5/1997 Fenton .......................... 181/144
5,635,686 A * 6/1997 Fenton .......................... 181/144
5,859,917 A * 1/1999 Silber et al. .................. 381/389
6,070,694 A * 6/2000 Burdett et al. ............... 181/150
6,095,278 A 8/2000 Lin
6,101,262 A * 8/2000 Haase et al. ................. 381/386
6,282,297 B1 8/2001 Lin
(Continued)

FOREIGN PATENT DOCUMENTS

JP 1228296 A 9/1989

*Primary Examiner* — Ida M Soward
(74) *Attorney, Agent, or Firm* — McKee, Voorhees & Sease, P.L.C.

(57) ABSTRACT

An improved audio speaker assembly is provided for directional adjustability of the woofer or driver. The assembly includes a housing comprising a baffle, a swivel, a swivel cup, and a retainer. The driver is mounted in the swivel. The swivel and swivel cup are mounted between the baffle and the retainer. The swivel is pivotal approximately 60° relative to the swivel cup, and is rotatable 360° relative to the baffle, thereby selectively positioning the driver in a desired direction. A pair of screws extend through the baffle and into the retainer, and can be tightened so as to lock or clamp the swivel and driver in the selected position, and preclude directional movement due to vibrations, temperature, and humidity.

9 Claims, 12 Drawing Sheets

U.S. PATENT DOCUMENTS

| | | | | |
|---|---|---|---|---|
| 6,356,640 | B1 | 3/2002 | Lin | |
| 6,683,963 | B2 * | 1/2004 | Sterns et al. | 381/182 |
| 6,792,125 | B1 * | 9/2004 | David et al. | 381/397 |
| 6,925,190 | B2 | 8/2005 | Popken et al. | |
| 7,121,756 | B2 | 10/2006 | Wright et al. | |
| 7,171,013 | B2 * | 1/2007 | Kosatos et al. | 381/182 |
| 7,178,628 | B2 * | 2/2007 | Gordon | 181/153 |
| 7,483,544 | B2 * | 1/2009 | Wright et al. | 381/336 |
| 7,522,742 | B2 * | 4/2009 | Francisco et al. | 381/345 |
| 7,587,059 | B2 * | 9/2009 | Wright | 381/387 |
| 8,014,554 | B2 * | 9/2011 | Xu et al. | 381/386 |
| 2006/0213718 | A1 * | 9/2006 | Lowell et al. | 181/152 |
| 2006/0239492 | A1 * | 10/2006 | Guenther | 381/386 |
| 2007/0144825 | A1 | 6/2007 | Gordon | |
| 2007/0189557 | A1 * | 8/2007 | Blackmon et al. | 381/182 |
| 2008/0247593 | A1 * | 10/2008 | Sprinkle | 381/387 |
| 2008/0247595 | A1 * | 10/2008 | Henry | 381/398 |
| 2009/0074225 | A1 * | 3/2009 | Lin | 381/387 |

* cited by examiner

SPEAKER ASSEMBLY WITH DIRECTIONAL ADJUSTABILITY

CROSS-REFERENCE TO RELATED APPLICATIONS

This application claims priority under 35 U.S.C. §119(e) to provisional application Ser. No. 61/051,027 filed May 7, 2008, herein incorporated by reference in its entirety.

BACKGROUND OF THE INVENTION

Ceiling and wall mounted audio speakers are well known in the industry. The earliest ceiling speakers had a fixed orientation such that the woofer and tweeter pointed substantially straight downwardly or outwardly. More recently, speakers have been designed with the pivotal and swivel components for directional adjustment of the woofer and/or tweeter. The orientation of such adjustable speakers generally is maintained by pressure between the components, which often are made of plastic. The various types of pressure couplings differ in the effort or force required to adjust the speaker to the desired position. These pressure fit components do not allow for adjustment of the tension during the assembly process, either during manufacturing or in the field during installation. Prior art adjustable speakers also use a pivot mechanism similar to a ball joint or fulcrum. None of these assemblies allow the speaker position to be firmly locked in place. Another problem with prior art adjustable speakers is limited rotation due to internal connecting wires.

Some prior art adjustable speakers also utilize friction from foam or other material to maintain the speaker components in the selected position. However, the foam tends to deteriorate over time, such that the desired position is difficult to maintain.

Prior art adjustable speakers also tend to vibrate out of position after installation, since the speaker is an active device which creates vibration. Such vibrations may loosen the components, which may result in an undesirable buzz or rattle noise.

The wide variations and ambient temperatures also complicate the long term integrity of the adjustable speakers. For example, ceiling speakers often are installed with the upper or rear portion exposed to the attic, which may have extreme temperature and humidity swings which create further problems, since the plastic components are hydroscopic.

Speaker manufacturers who build cabinet-type loudspeaker systems seek to minimize cabinet resonances and vibrations. Special bracing is provided to eliminate undesired vibrations. Ideally, all of the effort of the active speaker driver element (i.e., the woofer cone) should be translated to the movement of the driver cone. Cabinet vibrations or inadequate mounting of the driver to the cabinet creates a loss of energy in the performance of the driver, which translates to a muddy mid-range or base response from the speaker. Similar degredated performance is also typical in ceiling and wall mount speakers. Prior art adjustable ceiling mount speakers do not lock the driver firmly in the frame or baffle to prevent the undesired effects of vibration and energy loss, and therefore have less than optimal speaker performance.

Some speaker applications have additional vibrations, such as automobiles, trucks, and aircraft, due to movement of the vehicle along the road, through the water, or in the air. Such exterior vibrations also eventually lead to loosening of the prior art pivot mechanisms for the speakers, which then move from the desired directional setting.

Accordingly, a primary objective of the present invention is the provision of an improved speaker assembly having directional adjustability which can be quickly and easily set and maintained.

Another objective of the present invention is the provision of a speaker assembly with directional adjustability wherein the driver can be tilted and rotated with respect to the speaker housing.

A further objective of the present invention is the provision of an audio speaker assembly wherein the driver is supported so as to rotate 360° and pivot approximately 60°.

Yet another objective of the present invention is the provision of a speaker assembly whose direction can be adjusted to a greater range than prior art speaker assemblies.

Another objective of the present invention is the provision of improved speaker assembly mountable in a ceiling or wall with a driver than can be adjustably directed and clamped in the selected direction to preclude movement despite vibrations and changes in temperature and humidity.

A further objective of the present invention is the provision of a directionally adjustable speaker which can be selectively positioned and then locked in place after the speaker is mounted in a ceiling or wall.

Still another objective of the present invention is the provision of a speaker assembly wherein the driver can be selectively positioned from the front of the speaker assembly after installation of the speaker assembly in a ceiling or wall.

Another objective of the present invention is the provision of an audio speaker assembly having sonic improvement by firmly locking the driver element in a selected directional position.

Yet another objective of the present invention is the provision of an improved audio speaker assembly with directional adjustability that does not create buzzing or rattling over time.

A further objective of the present invention is the provision of an improved directionally adjustable audio speaker assembly which can be mounted in a ceiling or wall, as well as in an RV, boat, automobile, aircraft, or other vehicles which are subject to high vibrations.

Still another objective of the present invention is the provision of an improved audio speaker assembly which allows the speaker to be precisely aimed to a desired listening position in a room.

These and other objectives will become apparent from the following description of the invention.

DETAILED DESCRIPTION OF THE PREFERRED EMBODIMENT

Figure 1:
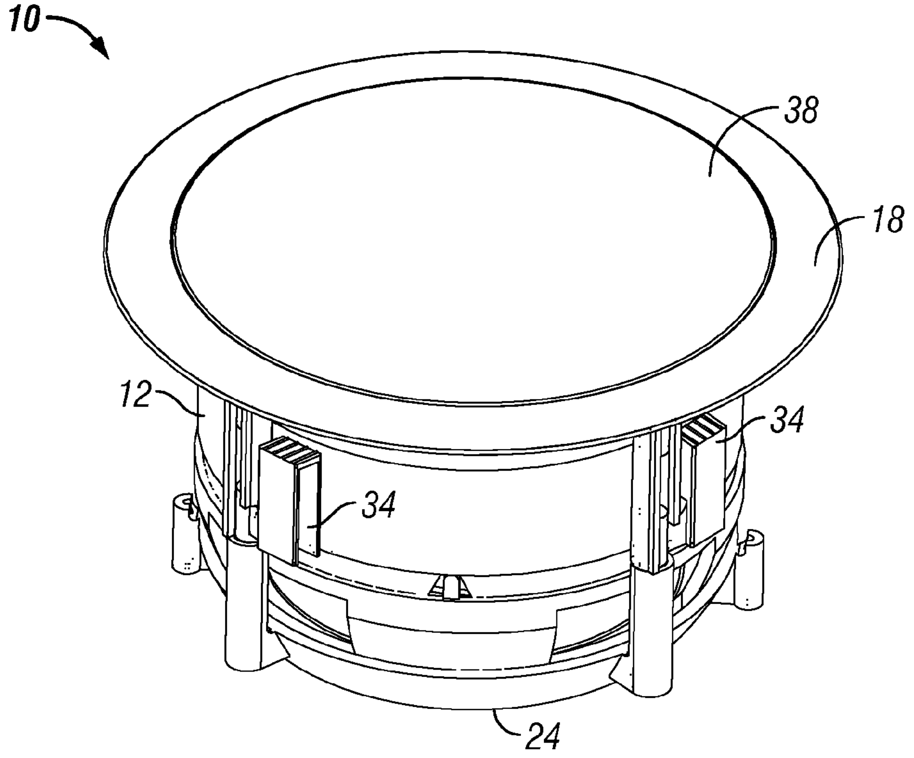
FIG. 1 is a perspective view of the speaker assembly having directional adjustability according to the present invention.
Figure 2:
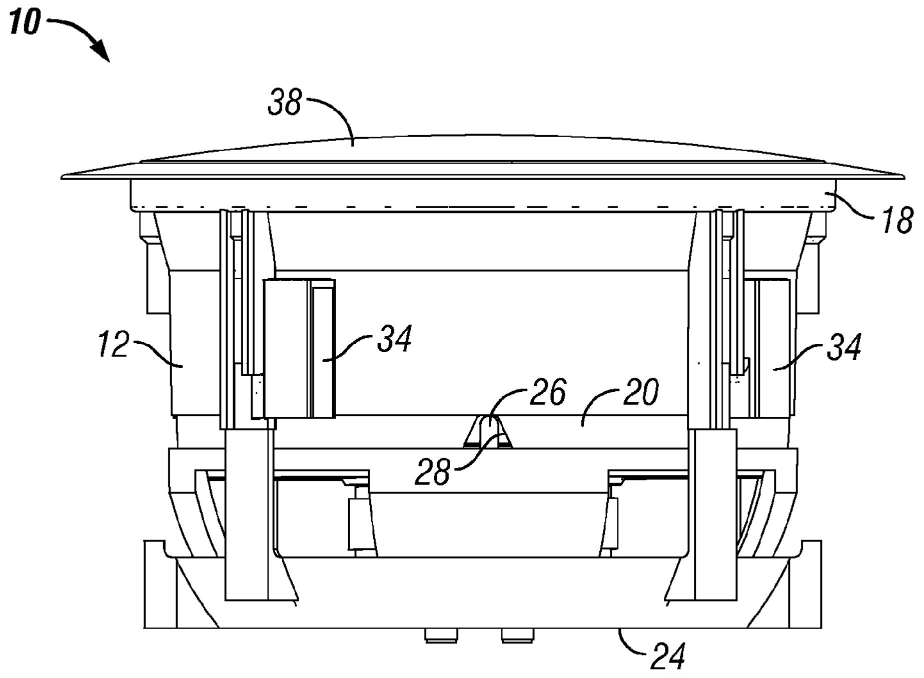
FIG. 2 is a side elevational view of the speaker assembly.
Figure 3:
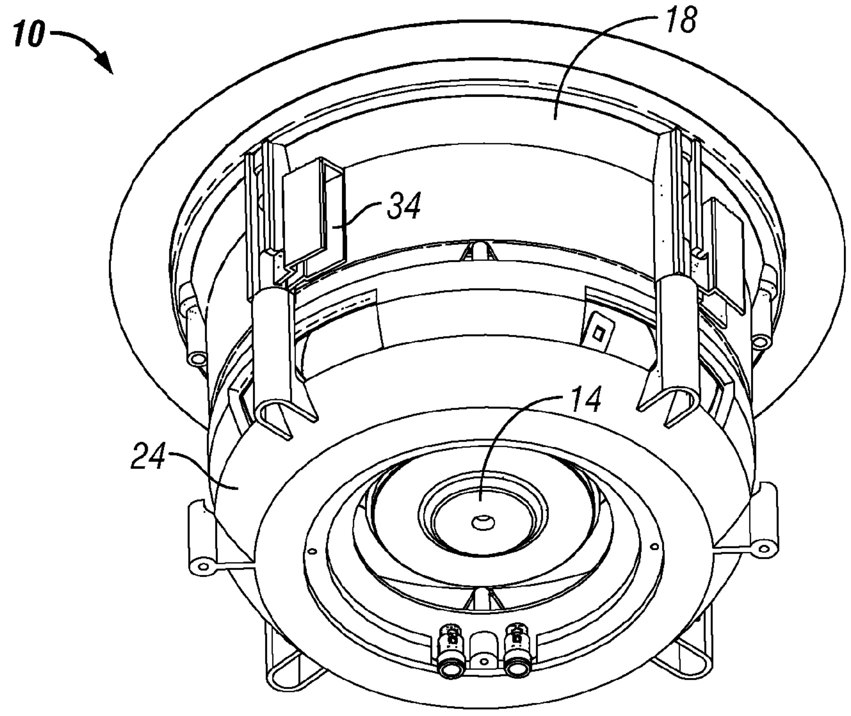
FIG. 3 is a bottom perspective view rotated approximately 45° from the view of FIG. 2.
Figure 4:
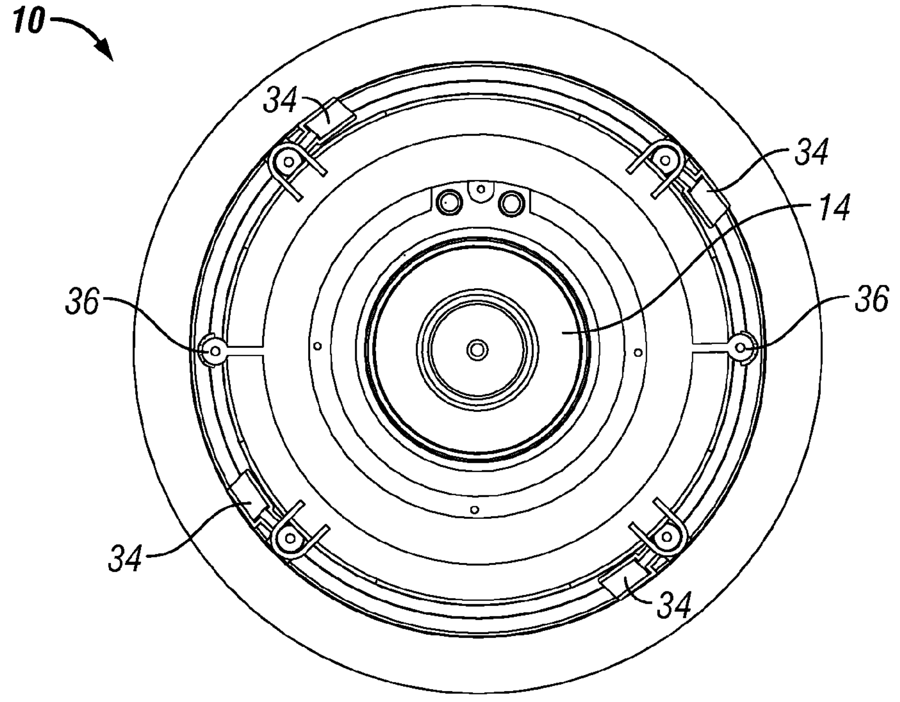
FIG. 4 is a bottom plan view of the speaker assembly.
Figure 5:
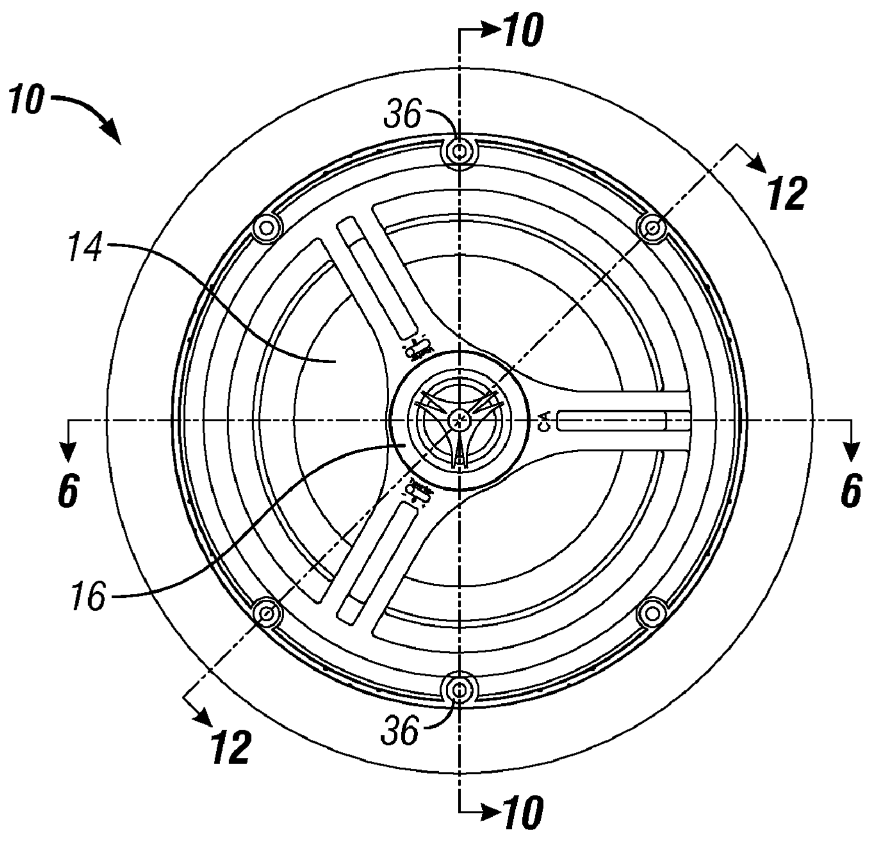
FIG. 5 is a top plan view of the speaker, with the decorative grill removed.

The speaker assembly of the present invention is generally designated in the drawings by the reference numeral 10. The assembly 10 includes a housing 12, a woofer or driver 14, and a tweeter 16. The housing 12 is designed so as to allow the driver 14 to be tilted and rotated about a center axis of the housing.

Figure 6:
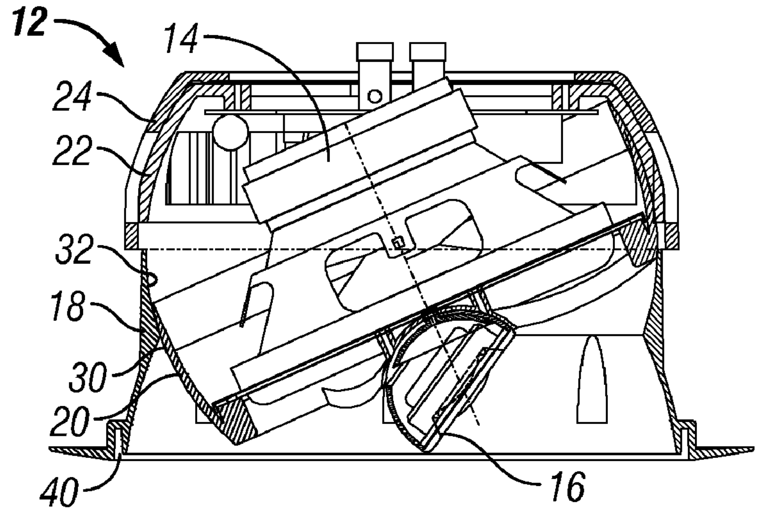
FIG. 6 is a sectional view taken along lines 6-6 of FIG. 5, with the driver and tweeter pivoted to an angular position.
Figure 7:
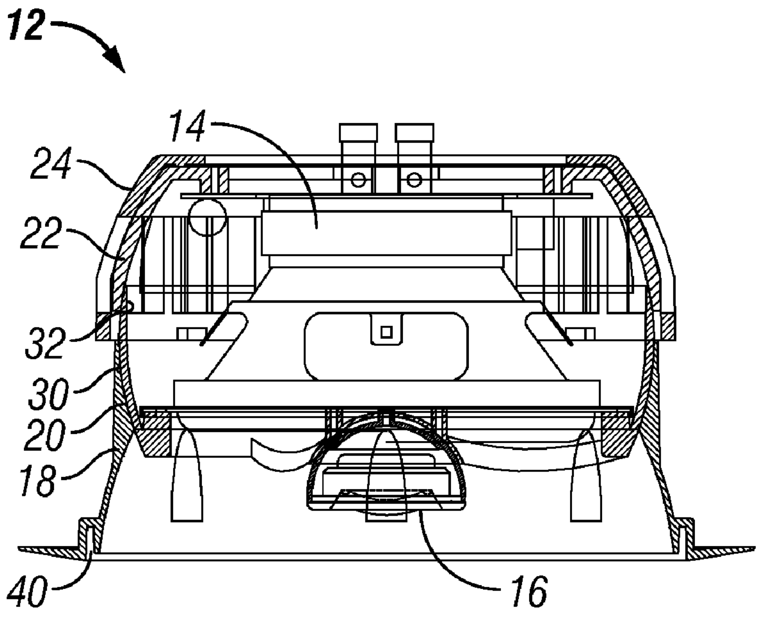
FIG. 7 is a view similar to FIG. 6, with the driver and tweeter in a centered position.
Figure 9:
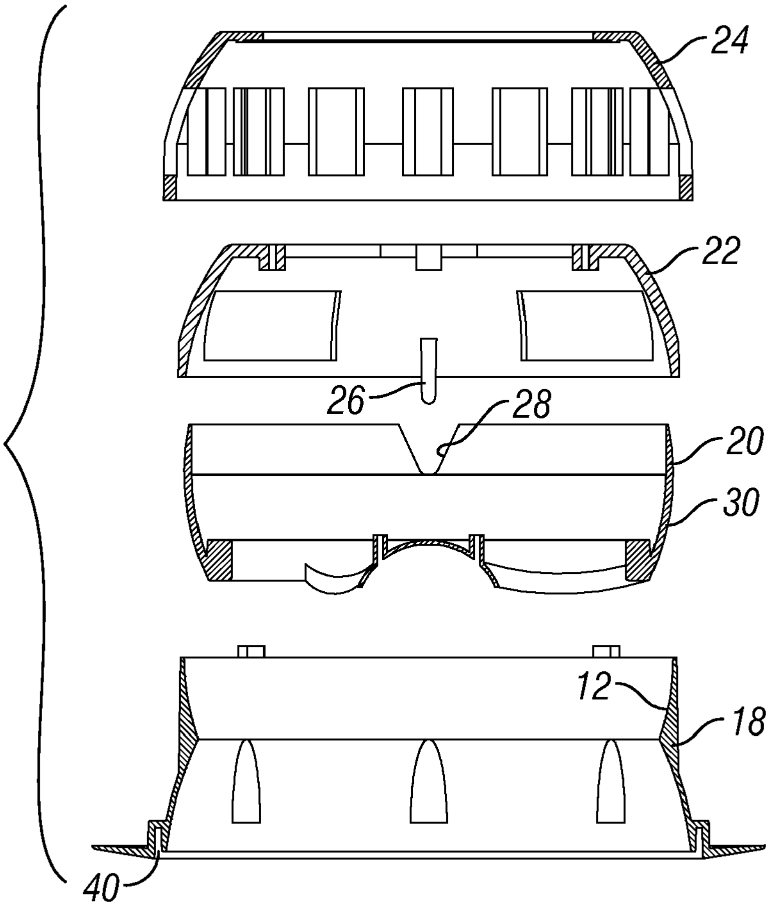
FIG. 9 is an exploded sectional view of the speaker housing components, without the grill, driver and tweeter.
Figure 11:
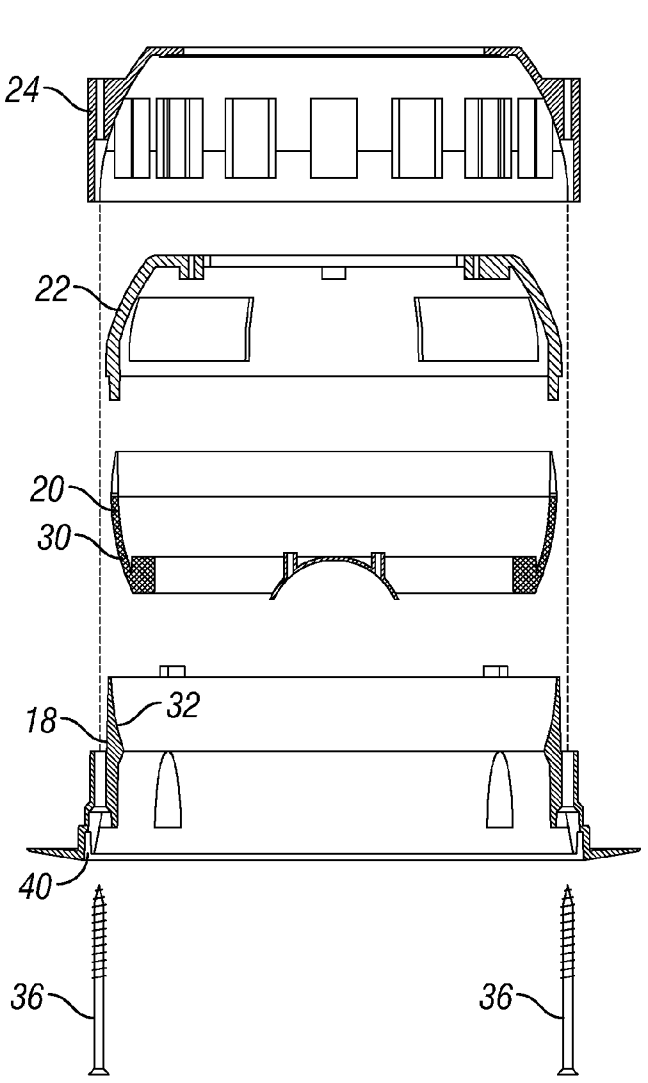
FIG. 11 is an exploded view from FIG. 10 showing the speaker housing components, without the grill, driver and tweeter.
Figure 12:
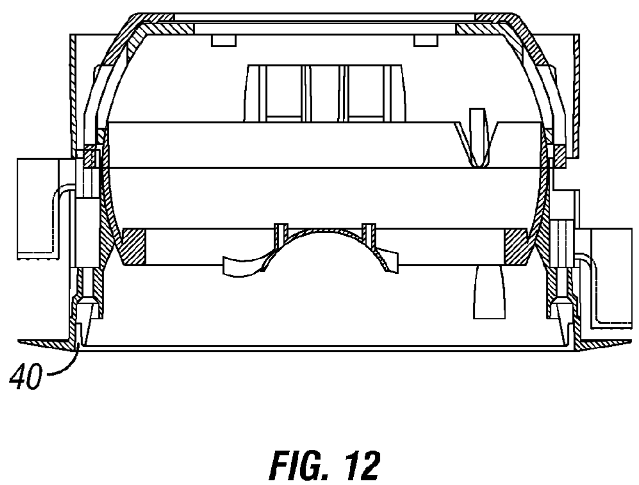
FIG. 12 is a sectional view taken along lines 12-12 of FIG. 5, with the driver and tweeter removed for clarity.
Figure 13:
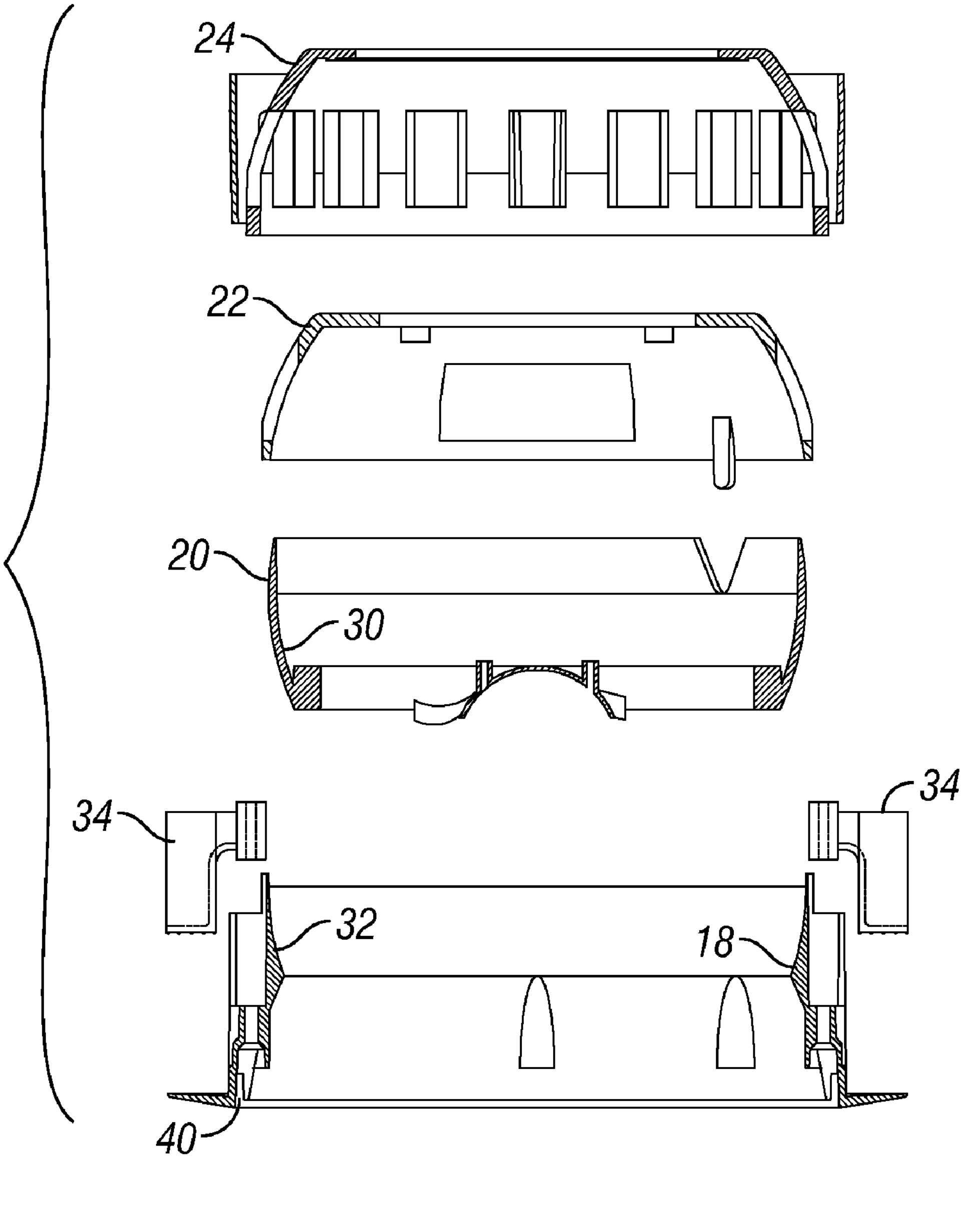
FIG. 13 is an exploded sectional view of the assembly shown in FIG. 12.
Figure 14:
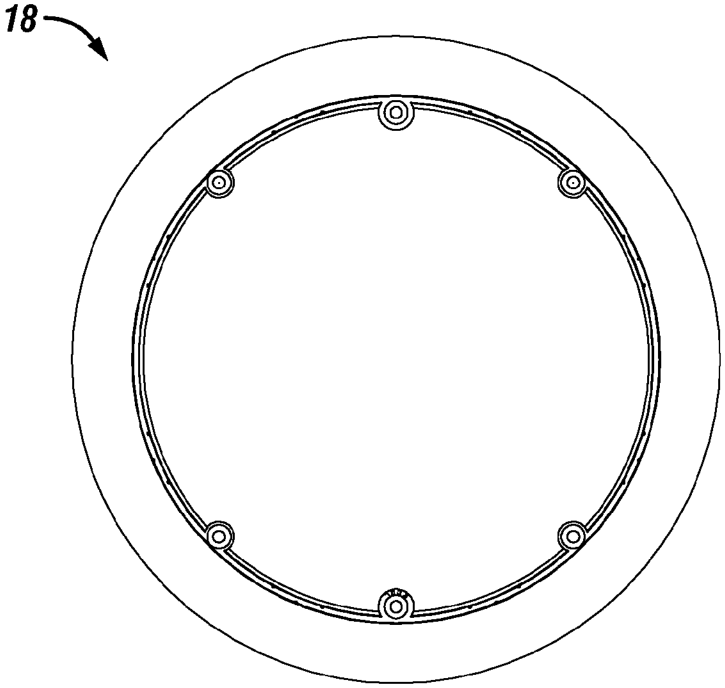
FIGS. 14 and 15 are top and bottom plan views of the baffle of the speaker housing, respectively.
Figure 15:
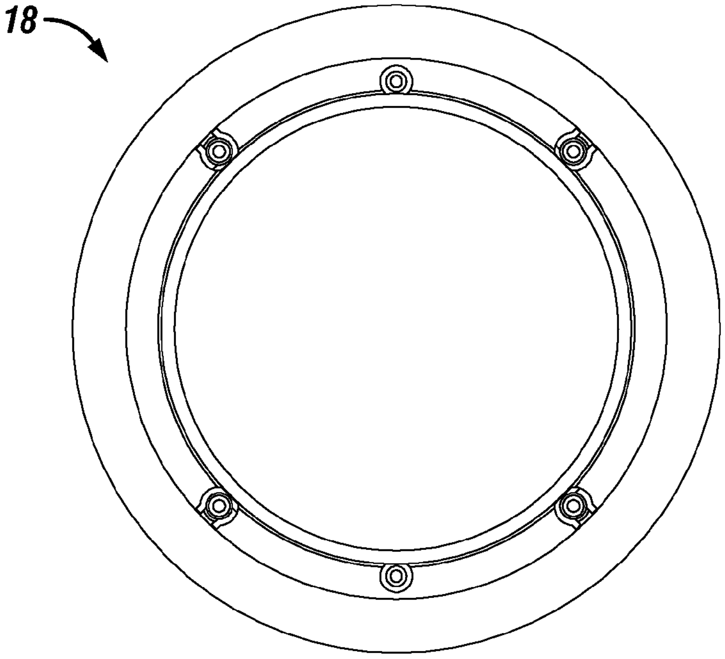
Figure 16:
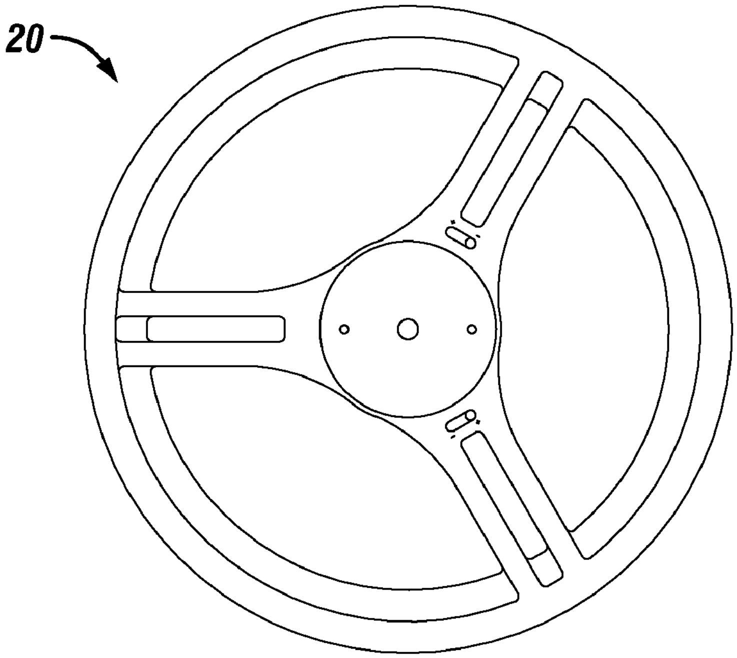
FIGS. 16 and 17 are top and bottom plan views of the swivel of the speaker housing, respectively.
Figure 17:
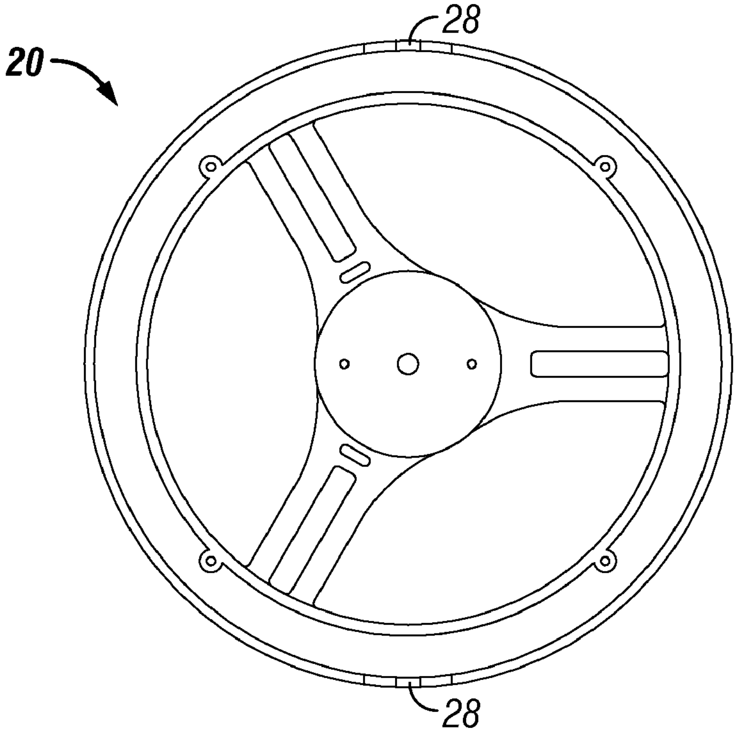
Figure 18:
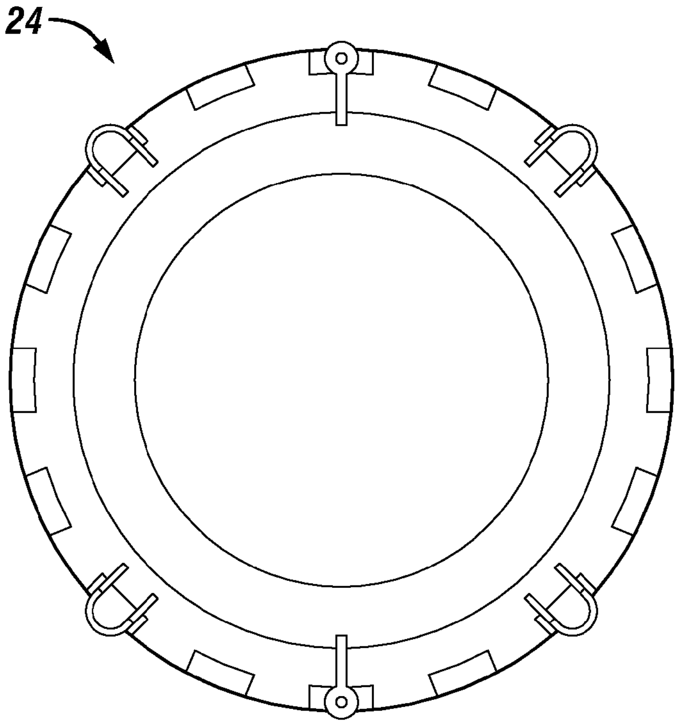
FIGS. 18 and 19 are top and bottom plan views of the retainer of the speaker housing, respectively.
Figure 19:
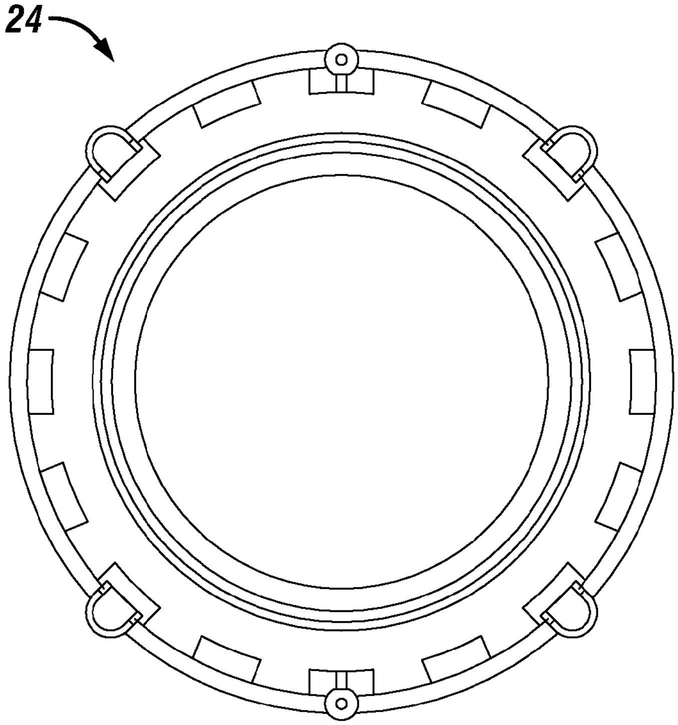
Figure 20:
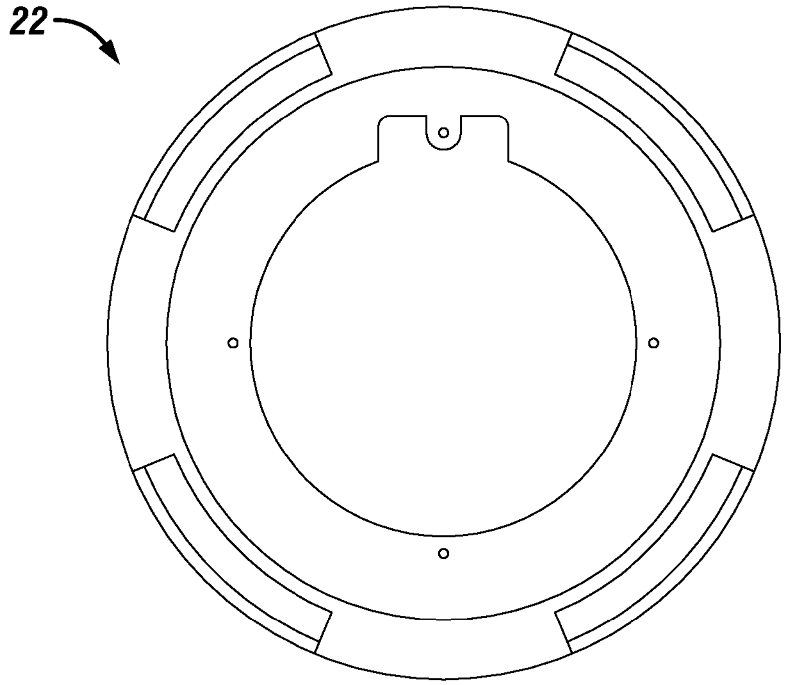
FIGS. 20 and 21 are top and bottom plan views of the swivel cup of the speaker housing, respectively.
Figure 21:
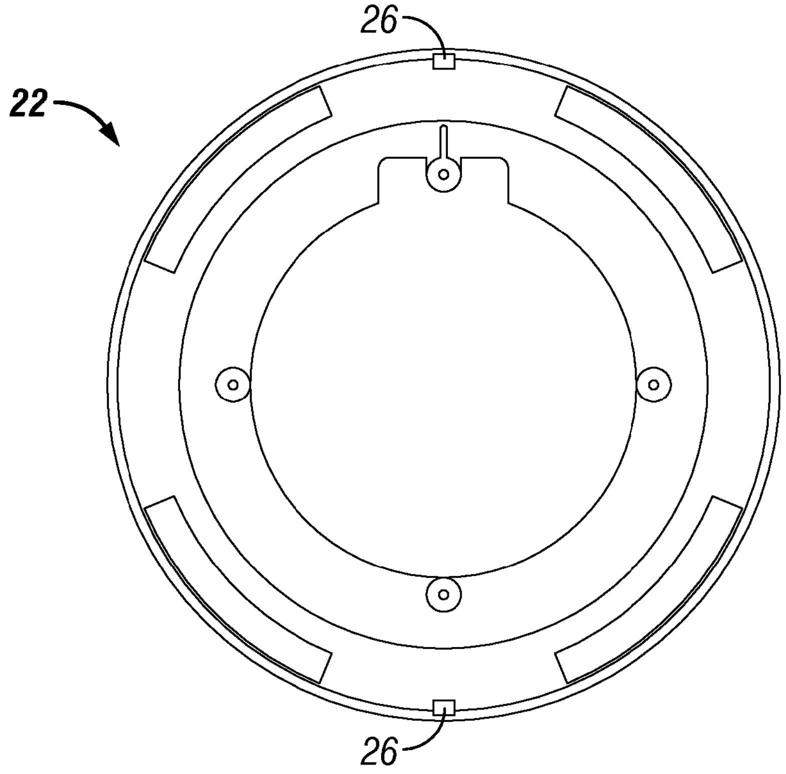
Figure 22:
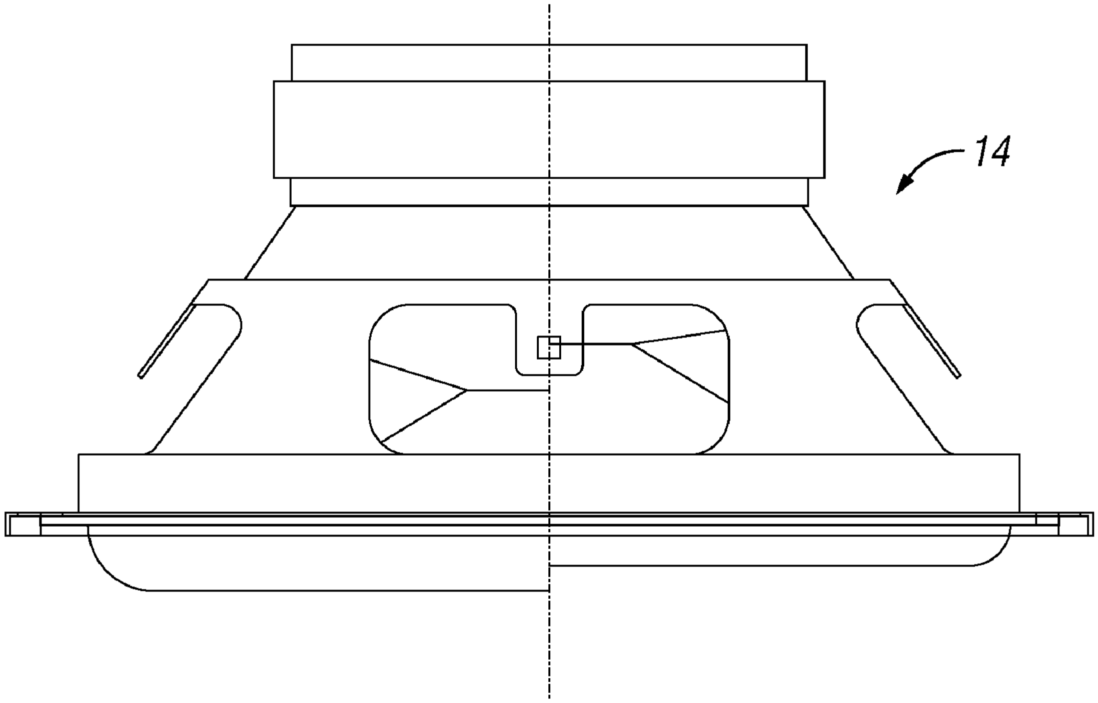
FIG. 22 is a side elevation view of the driver of the speaker assembly.

More particularly, the housing 12 includes four primary components, the baffle 18, the swivel 20, the swivel cup 22, and the retainer 24, as best seen in FIGS. 9, 11 and 13. The driver 14 and tweeter 16 are mounted in the swivel 20. The swivel cup 22 includes a pair of ribs 26 (FIGS. 9 and 21) extending downwardly from the opposite sides of the cup 22. The swivel 20 has a pair of recesses 28 (FIGS. 9 and 17) formed on the opposite sides to receive the ribs 26 and pivot about the ribs approximately 30° in either direction. Thus, the total pivotal movement of the swivel 20 relative to the swivel cup 22 is approximately 60°. For example, FIG. 6 shows the swivel 20 and driver 14 pivoted fully to the right, approximately 30° from vertical. It is understood that the swivel 20 and driver 14 will similarly pivot to the left approximately 30° from vertical. FIG. 7 shows the swivel 20 and driver 14 in a centered or straight position.

Figure 8:
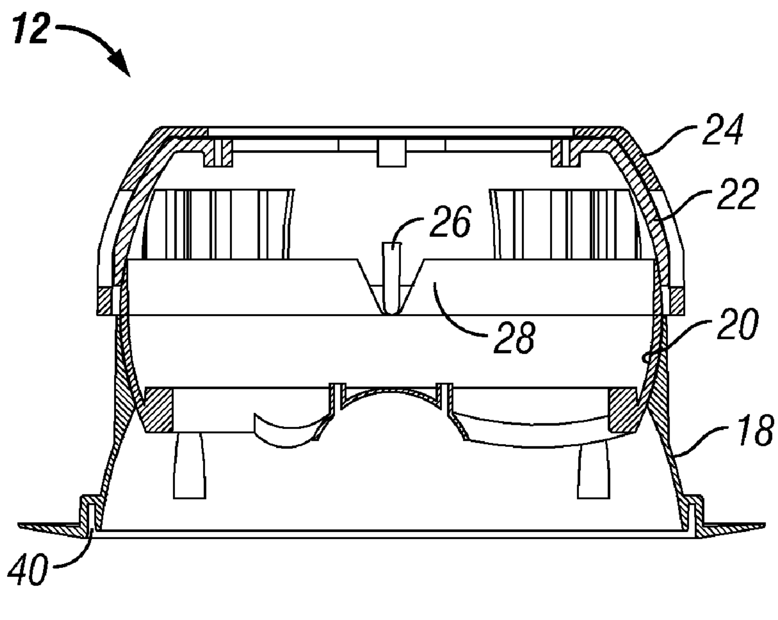
FIG. 8 is a sectional view similar to FIG. 6, and showing the assembled speaker housing, with the driver and tweeter removed for clarity.
Figure 10:
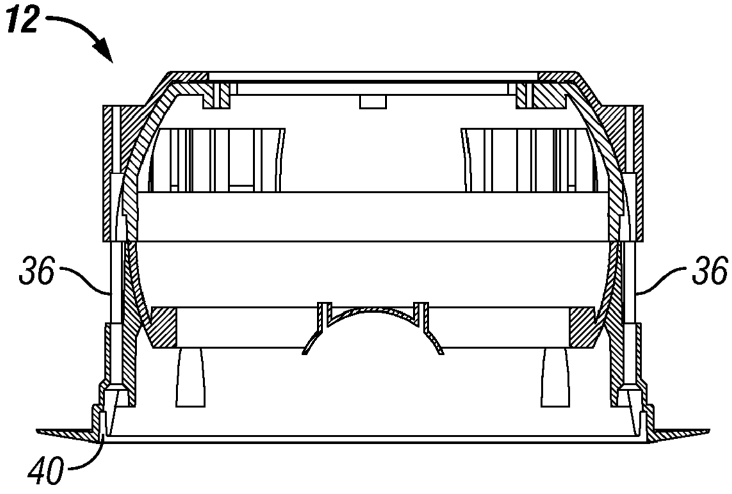
FIG. 10 is a sectional view taken along lines 10-10 of FIG. 5, with the driver and tweeter removed for clarity.

The outer perimeter of the wall 30 of the swivel 20 is round and slightly tapered from top to bottom. The baffle 18 includes round upper perimeter wall 32 which is slightly tapered from top to bottom so as to matingly receive the swivel 20 in a nested relationship. (See FIGS. 6, 8 and 10). Thus, the swivel 20 and the swivel cup 22 are free to rotate 360° within the baffle 18.

The assembly 10 is mounted in a ceiling or wall using toggles 34, as is conventional in the industry. After the assembly 10 is installed in an opening in the ceiling or wall and the toggles 34 are tightened, the swivel 20 can be tilted relative to the swivel cup 20, and the swivel 20 and cup 22 can be rotated within the baffle 18, so that the driver 14 is oriented in a desired direction within the room. Then, screws 36 (FIG. 11) are inserted through the baffle 18 and into the retainer 24 and tightened, to draw the baffle 18 and retainer 24 together so as to clamp the swivel 20 and swivel cup 22 into a fixed position, as previously oriented. Tightening of the screws 36 locks the swivel 20 and swivel cup 22 into position, and thereby the driver 14, so as to preclude movement caused by vibrations or changes in temperature and/or humidity. If the direction of the driver 14 needs to be changed, the screws 36 can be loosened, the swivel 20 and swivel cup 22 adjusted, and then the screws 36 re-tightened. The screws 36 are easily accessible from the front of the housing 12.

A grill 38 is mounted to the baffle 18, in any convenient manner, in covering relation to the driver 14 and tweeter 16. For example, the baffle 18 may have an annular recess 40, as seen in FIGS. 9, 11 and 13, with the grill 38 having a mating lip (not shown) adapted to press fit or friction fit into the recess 40 to removably retain the grill 38 on the baffle 18.

The unique tilt and rotate design of the speaker assembly 10 allows for positioning the driver 14 towards the listening area with the improved precision and without interference from the speaker wires. The screws 36 can be loosened and tightened from the front of the speaker assembly 10, to quickly and easily adjust the position of the driver 14 before the decorative grill 38 is attached on the front of the baffle 18. The baffle 18, the swivel 20, the swivel cup 22 and the retainer 24 allow for a finer degree of adjustability during the manufacturing assembly process, as well as during installation in the field without removing the assembly from the wall, ceiling, or vehicle. The movement of the swivel 20 is smooth and fluid, rather than being too loose or too tight. Once the adjustment to the swivel 20 is made, the installer can easily lock the driver 14 into the selected position by tightening the screws 36 so as to clamp and maintain the swivel 20 in the selected position.

The tweeter 16 of the speaker assembly 10 is also pivotal or tiltable for directional adjustment. For example, as seen in FIGS. 8-13 and 23, the tweeter 16 is centered or directed straight out from the swivel 20. FIGS. 6 and 24 show the tweeter 16 pivoted to the right and to the left, respectively, with respect to the swivel 20. The structure for the pivoting tweeter is described in Applicant's co-pending application Ser. No. 12/199,395 filed on Aug. 27, 2008, which is incorporated herein by reference.

The speaker assembly 10 can be used in numerous environments, including ceilings and walls in a room, as well as in vehicles such as RVs, boats, automobiles, and aircraft. The vibrations of such vehicles do not affect the positioning of the driver 14 due to the clamping action of the baffle 18 and retainer 24 on the swivel 20.

The invention has been shown and described above with the preferred embodiments, and it is understood that many modifications, substitutions, and additions may be made which are within the intended spirit and scope of the invention. From the foregoing, it can be seen that the present invention accomplishes at least all of its stated objectives.

What is claimed is:

1. An audio speaker assembly adapted to be mounted to a ceiling or wall surface, comprising:
- a baffle;
- a swivel;
- a swivel cup;
- a retainer;
- the swivel and swivel cup being mounted between the baffle and the retainer;
- a driver mounted in the swivel;
- the swivel being pivotal relative to the swivel cup about a pivotal axis;
- the swivel and swivel cup being rotatable 360° relative to the baffle about a rotation axis;
- the pivot and rotation axes being substantially perpendicular to one another;
- whereby the driver is directionally adjustable about the pivot and rotation axes; and
- a lock on the baffle and retainer to hold the driver in a selected directional position.

2. The audio speaker assembly of claim 1 wherein the swivel is pivotal approximately 60° within the swivel cup.

3. The audio speaker assembly of claim 1 wherein the lock clamps the baffle and retainer together to preclude movement of the swivel and swivel cup after the position of the driver is set.

4. The audio speaker assembly of claim 1 wherein the lock includes screws extending through the baffle and into the retainer.

5. The audio speaker assembly of claim 4 wherein the screws extend rearwardly into the retainer and are tightened from a front side of the baffle.

6. The audio speaker assembly of claim 1 wherein the swivel and baffle have complimentary shaped engaging surfaces.

7. The audio speaker assembly of claim 1 wherein the swivel includes a pair of ribs and the swivel cup has a pair of recesses to receive the ribs for pivotal movement of the ribs in the recesses.

8. The audio speaker assembly of claim 1 wherein the position of the driver is locked after the assembly is installed in a wall or ceiling.

9. The audio speaker assembly of claim 1 wherein the lock can be disengaged for re-positioning the swivel.

* * * * *